United States Patent
Chien et al.

(10) Patent No.: US 10,631,427 B1
(45) Date of Patent: Apr. 21, 2020

(54) SYSTEMS AND METHODS FOR RETAINING INFORMATION HANDLING RESOURCE CARD

(71) Applicant: Dell Products L.P., Round Rock, TX (US)

(72) Inventors: Tung Yu Chien, New Taipei (TW); Chen-Fa Wu, Tao-Yuan (TW)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/232,805

(22) Filed: Dec. 26, 2018

(51) Int. Cl.
*H05K 7/14* (2006.01)

(52) U.S. Cl.
CPC ......... *H05K 7/1431* (2013.01); *H05K 7/1401* (2013.01); *H05K 7/1461* (2013.01)

(58) Field of Classification Search
None
See application file for complete search history.

(56) References Cited

U.S. PATENT DOCUMENTS

| | | | | |
|---|---|---|---|---|
| 4,354,770 | A * | 10/1982 | Block | F16B 2/14 254/104 |
| 4,480,287 | A * | 10/1984 | Jensen | H05K 7/1404 361/707 |
| 5,831,821 | A | 11/1998 | Scholder et al. | |
| 6,252,514 | B1 | 6/2001 | Nolan et al. | |
| 6,556,451 | B1 | 4/2003 | Feightner et al. | |
| 7,322,843 | B1 * | 1/2008 | Lee | H05K 7/1404 439/327 |
| 7,483,271 | B2 * | 1/2009 | Miller | H05K 7/1404 165/80.2 |
| 7,505,251 | B2 * | 3/2009 | Canfield | H05K 5/0217 361/679.02 |
| 8,014,156 | B2 * | 9/2011 | Signer | G06F 1/181 361/752 |
| 8,456,846 | B2 * | 6/2013 | Mosier | F16B 2/14 361/728 |
| 8,498,104 | B2 * | 7/2013 | Lin | G11B 33/128 312/223.2 |
| 9,167,714 | B2 * | 10/2015 | Paquette | H05K 7/1404 |
| 9,629,291 | B1 | 4/2017 | Chen et al. | |
| 9,655,269 | B2 * | 5/2017 | Paykarimah | H05K 7/1418 |
| 10,042,396 | B1 * | 8/2018 | Gupta | H05K 7/1487 |
| 10,146,271 | B1 | 12/2018 | Pav et al. | |
| 10,182,509 | B1 * | 1/2019 | Jensen | H05K 7/1404 |
| 2003/0048618 | A1 * | 3/2003 | Adams, Sr. | H05K 7/1404 361/740 |
| 2012/0281373 | A1 | 11/2012 | Bohannan et al. | |
| 2013/0309007 | A1 * | 11/2013 | Pawlowski | H05K 7/20509 403/374.3 |

(Continued)

*Primary Examiner* — Xanthia C Cunningham
(74) *Attorney, Agent, or Firm* — Jackson Walker L.L.P.

(57) ABSTRACT

In accordance with embodiments of the present disclosure, an information handling system may include a chassis and a retention assembly mechanically coupled to the chassis and configured to retain an information handling resource card. The retention assembly may include a fixed member, a movable member mechanically coupled to the fixed member such that the movable member is movable relative to the fixed member in a linear axis, and at least one fastener configured to mechanically engage with the fixed member in order to maintain the movable member in a desired position relative to the fixed member.

20 Claims, 3 Drawing Sheets

(56) References Cited

U.S. PATENT DOCUMENTS

| | | |
|---|---|---|
| 2014/0106595 A1 | 4/2014 | Zhu |
| 2015/0115120 A1 | 4/2015 | Yu |
| 2016/0064040 A1 | 3/2016 | Hartman et al. |
| 2016/0066468 A1 | 3/2016 | Smith et al. |

* cited by examiner

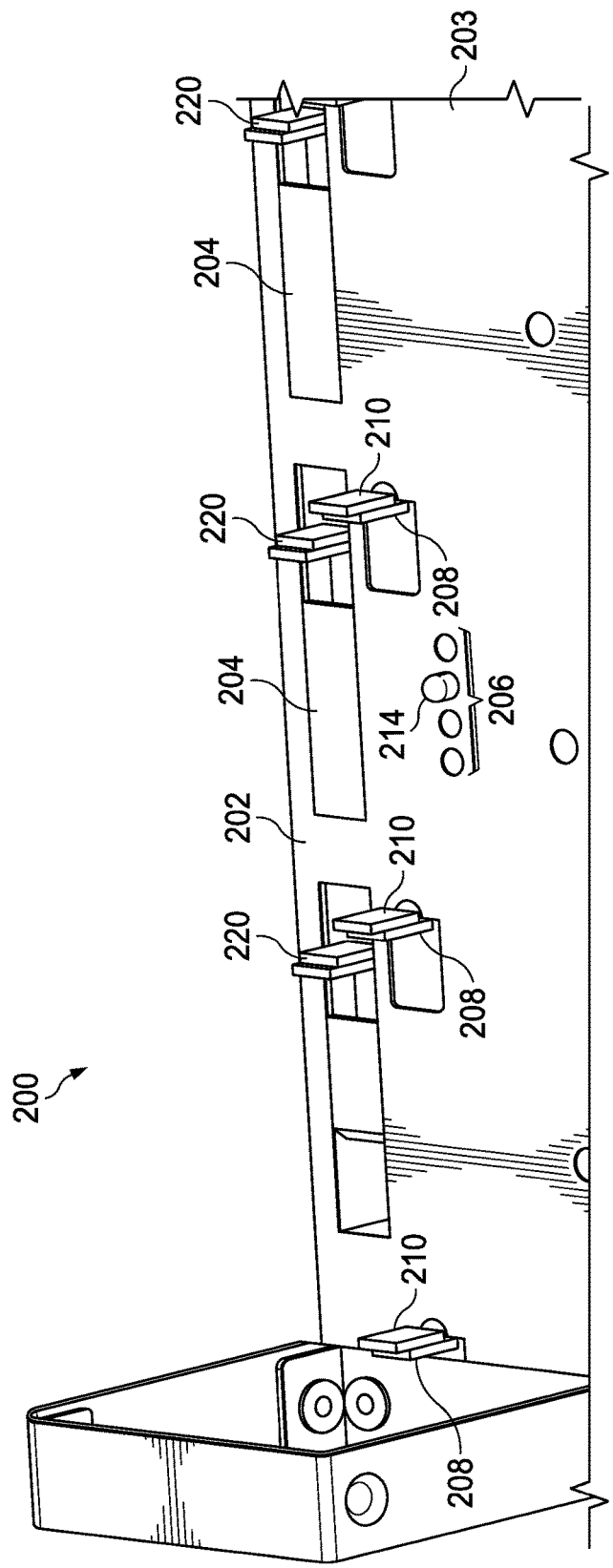
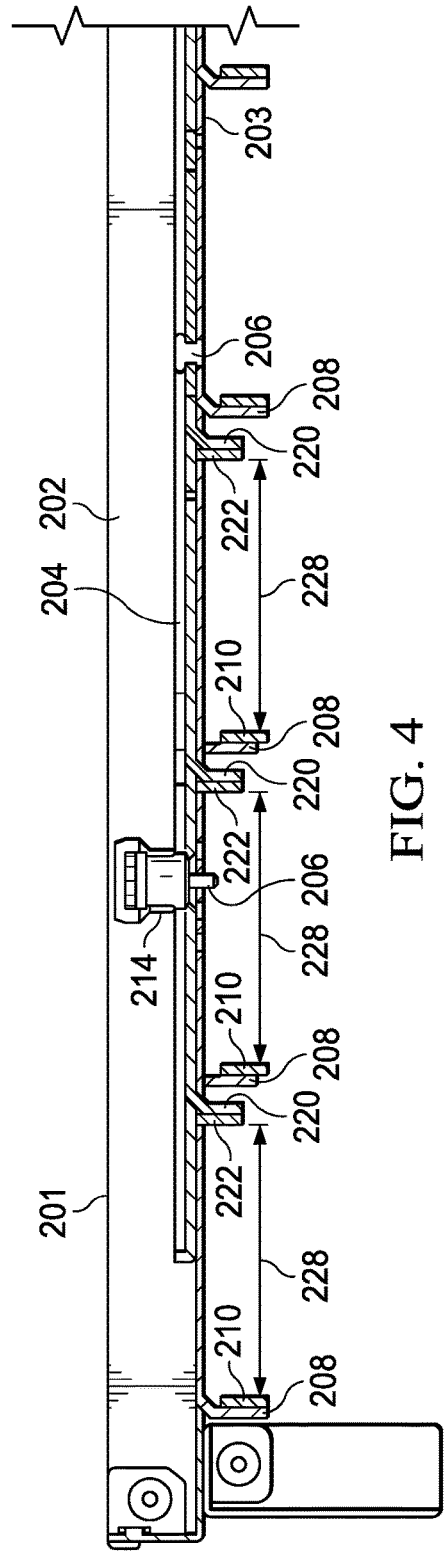
FIG. 3
FIG. 4

SYSTEMS AND METHODS FOR RETAINING INFORMATION HANDLING RESOURCE CARD

TECHNICAL FIELD

The present disclosure relates in general to information handling systems, and more particularly to systems and methods for retaining an information handling resource card in information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Although an information handling system may support many different types of information handling resource form factors, providing for mechanical alignment and retention of many different form factors may be challenging. For example, many vendors produce graphics processing unit (GPU) cards for use in information handling systems, but not all of such cards may be mechanically aligned at their rear ends due to form factors not being defined in the relevant technical specification. Thus, it may be difficult to produce an information handling system having a common design capable of mechanically aligning and retaining such various form factors.

It should be noted that the discussion of a technique in the Background section of this disclosure does not constitute an admission of prior-art status. No such admissions are made herein, unless clearly and unambiguously identified as such.

SUMMARY

In accordance with the teachings of the present disclosure, the disadvantages and problems associated with mechanical retention of information handling resources may be reduced or eliminated.

In accordance with embodiments of the present disclosure, an information handling system may include a chassis and a retention assembly mechanically coupled to the chassis and configured to retain an information handling resource card. The retention assembly may include a fixed member, a movable member mechanically coupled to the fixed member such that the movable member is movable relative to the fixed member in a linear axis, and at least one fastener configured to mechanically engage with the fixed member in order to maintain the movable member in a desired position relative to the fixed member.

In accordance with these and other embodiments of the present disclosure, a retention assembly configured to retain an information handling resource card may include a fixed member, a movable member mechanically coupled to the fixed member such that the movable member is movable relative to the fixed member in a linear axis, and at least one fastener configured to mechanically engage with the fixed member in order to maintain the movable member in a desired position relative to the fixed member.

In accordance with these and other embodiments of the present disclosure, a method for constructing a retention assembly configured to retain an information handling resource card, may include mechanically coupling a movable member to a fixed member such that the movable member is movable relative to the fixed member in a linear axis and mechanically engaging at least one fastener with the fixed member in order to maintain the movable member in a desired position relative to the fixed member.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 3 illustrates a perspective view of a side of an example retention assembly opposite to the side depicted in FIG. 2, in accordance with embodiments of the present disclosure; and FIG. 4 illustrates a bottom plan view of the example retention assembly depicted in FIGS. 2 and 3, in accordance with embodiments of the present disclosure.

DETAILED DESCRIPTION

Figure 1:
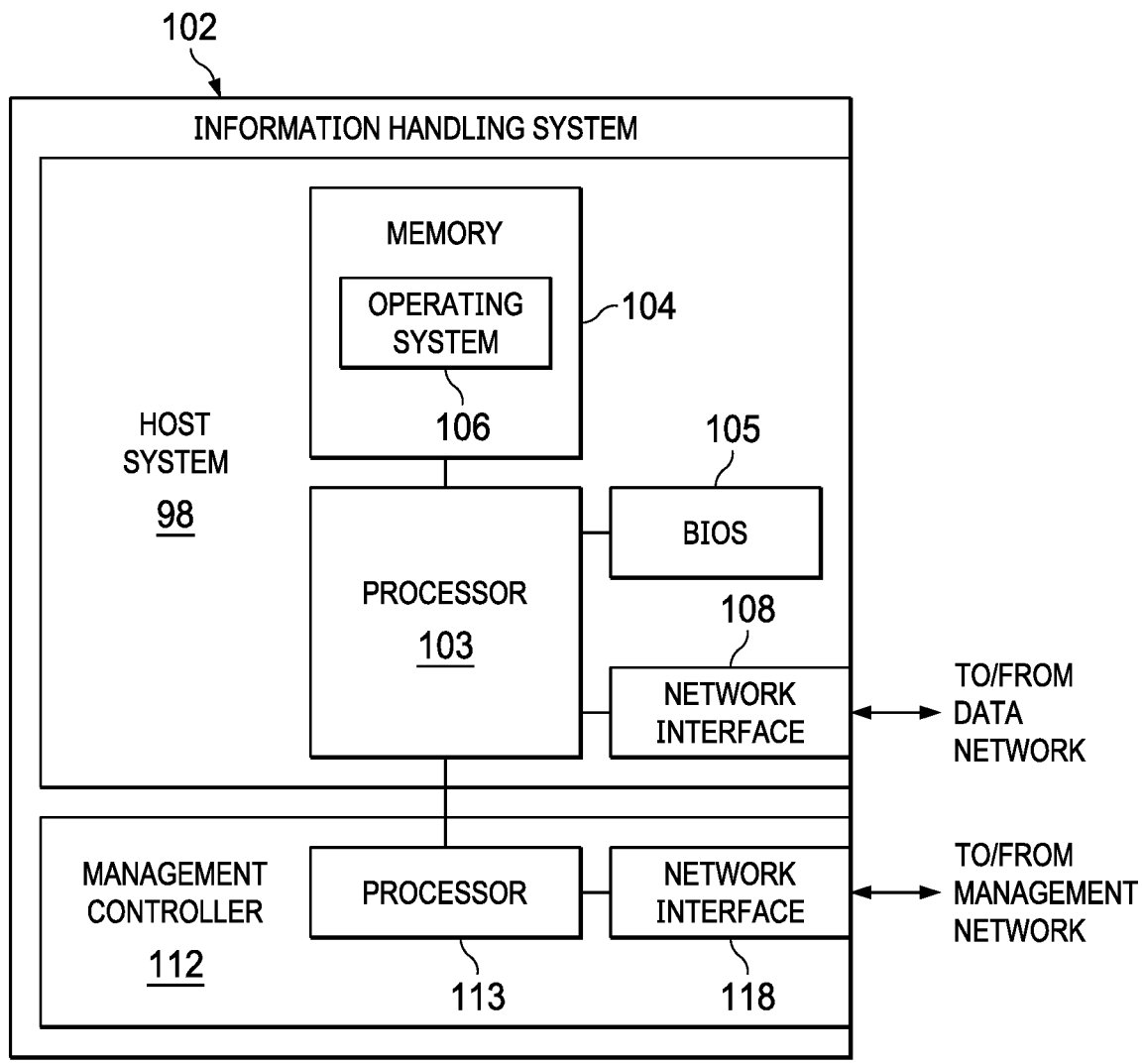
FIG. 1 illustrates a block diagram of an example information handling system, in accordance with embodiments of the present disclosure.

Preferred embodiments and their advantages are best understood by reference to FIGS. 1 through 4, wherein like numbers are used to indicate like and corresponding parts.

For the purposes of this disclosure, the term "information handling system" may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For purposes of this disclosure, when two or more elements are referred to as "coupled" to one another, such term indicates that such two or more elements are in electronic communication or mechanical communication, as applicable, whether connected directly or indirectly, with or without intervening elements.

When two or more elements are referred to as "coupleable" to one another, such term indicates that they are capable of being coupled together.

For the purposes of this disclosure, the term "computer-readable medium" (e.g., transitory or non-transitory computer-readable medium) may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; communications media such as wires, optical fibers, microwaves, radio waves, and other electromagnetic and/or optical carriers; and/or any combination of the foregoing.

For the purposes of this disclosure, the term "information handling resource" may broadly refer to any component system, device, or apparatus of an information handling system, including without limitation processors, service processors, basic input/output systems, buses, memories, I/O devices and/or interfaces, storage resources, network interfaces, motherboards, and/or any other components and/or elements of an information handling system.

For the purposes of this disclosure, the term "management controller" may broadly refer to an information handling system that provides management functionality (typically out-of-band management functionality) to one or more other information handling systems. In some embodiments, a management controller may be (or may be an integral part of) a baseboard management controller (BMC), a chassis management controller (CMC), or a remote access controller (e.g., a Dell Remote Access Controller or Integrated Dell Remote Access Controller).

FIG. 1 illustrates a block diagram of an example information handling system 102, in accordance with embodiments of the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data (which may generally be referred to as "physical storage resources"). As shown in FIG. 1, information handling system 102 may comprise a processor 103, a memory 104 communicatively coupled to processor 103, a Basic Input/Output System (BIOS) 105 (e.g., a Unified Extensible Firmware Interface (UEFI) BIOS) communicatively coupled to processor 103, a network interface 108 communicatively coupled to processor 103, and a management controller 112 communicatively coupled to processor 103.

In operation, processor 103, memory 104, BIOS 105, and network interface 108 may comprise at least a portion of a host system 98 of information handling system 102. In addition to the elements explicitly shown and described, information handling system 102 may include one or more other information handling resources.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may include any system, device, or apparatus configured to retain program instructions and/or data for a period of time (e.g., computer-readable media). Memory 104 may include RAM, EEPROM, a PCMCIA card, flash memory, magnetic storage, opto-magnetic storage, or any suitable selection and/or array of volatile or non-volatile memory that retains data after power to information handling system 102 is turned off.

As shown in FIG. 1, memory 104 may have stored thereon an operating system 106. Operating system 106 may comprise any program of executable instructions (or aggregation of programs of executable instructions) configured to manage and/or control the allocation and usage of hardware resources such as memory, processor time, disk space, and input and output devices, and provide an interface between such hardware resources and application programs hosted by operating system 106. In addition, operating system 106 may include all or a portion of a network stack for network communication via a network interface (e.g., network interface 108 for communication over a data network). Although operating system 106 is shown in FIG. 1 as stored in memory 104, in some embodiments operating system 106 may be stored in storage media accessible to processor 103, and active portions of operating system 106 may be transferred from such storage media to memory 104 for execution by processor 103.

Network interface 108 may comprise one or more suitable systems, apparatuses, or devices operable to serve as an interface between information handling system 102 and one or more other information handling systems via an in-band network. Network interface 108 may enable information handling system 102 to communicate using any suitable transmission protocol and/or standard. In these and other embodiments, network interface 108 may comprise a network interface card, or "NIC." In these and other embodiments, network interface 108 may be enabled as a local area network (LAN)-on-motherboard (LOM) card.

Management controller 112 may be configured to provide management functionality for the management of information handling system 102. Such management may be made by management controller 112 even if information handling system 102 and/or host system 98 are powered off or powered to a standby state. Management controller 112 may include a processor 113 and a network interface 118 separate from and physically isolated from network interface 108.

As shown in FIG. 1, processor 113 of management controller 112 may be communicatively coupled to processor 103. Such coupling may be via a Universal Serial Bus (USB), System Management Bus (SMBus), and/or one or more other communications channels.

Network interface 118 may be coupled to a management network, which may be separate from and physically isolated from the data network as shown. Network interface 118 of management controller 112 may comprise any suitable system, apparatus, or device operable to serve as an interface between management controller 112 and one or more other information handling systems via an out-of-band management network. Network interface 118 may enable management controller 112 to communicate using any suitable transmission protocol and/or standard. In these and other embodiments, network interface 118 may comprise a network interface card, or "NIC." Network interface 118 may be the same type of device as network interface 108, or in other embodiments it may be a device of a different type.

In addition to processor 103, memory 104, BIOS 105, network interface 108, and management controller 112, information handling system 102 may include one or more other information handling resources.

Figure 2:
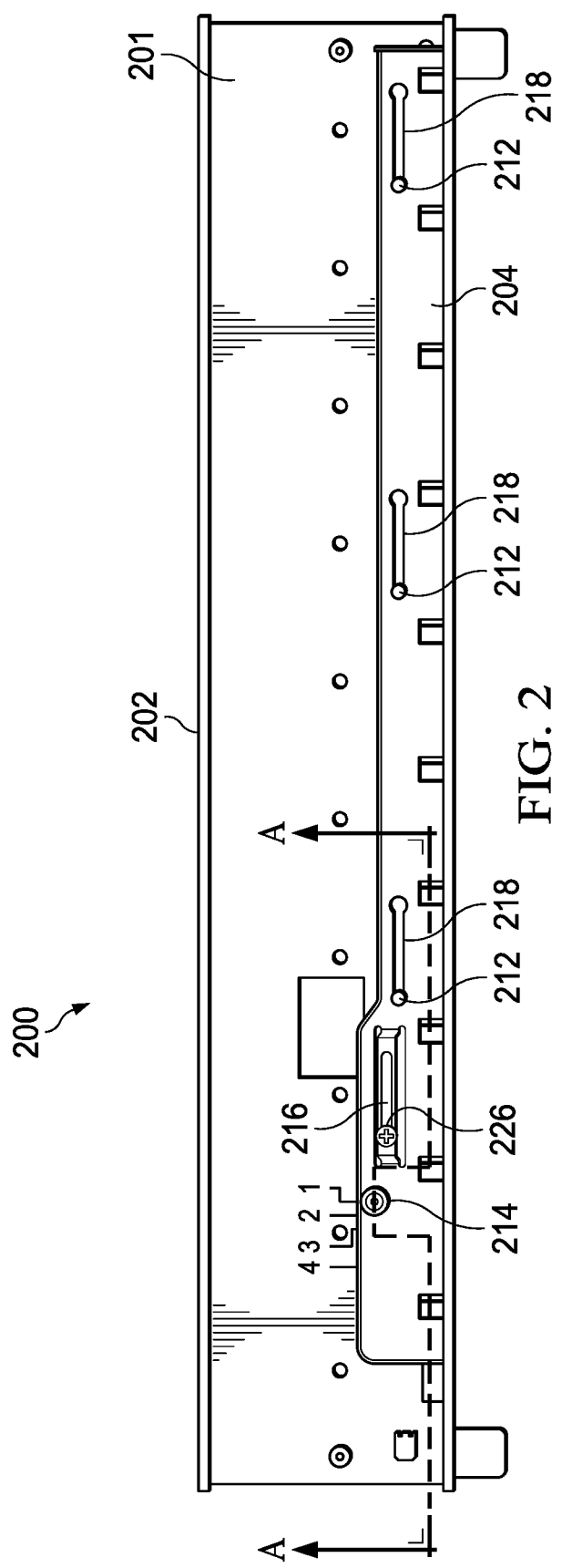
FIG. 2 illustrates an elevation view of one side of an example retention assembly, in accordance with embodiments of the present disclosure.

FIG. 2 illustrates an elevation view of a side 201 of an example retention assembly 200, in accordance with embodiments of the present disclosure. FIG. 3 illustrates a perspective view of a side 203 of example retention assembly 200 opposite to side 201 depicted in FIG. 2, in accordance with embodiments of the present disclosure. FIG. 4 illustrates a bottom plan view of example retention assembly 200 taken along section A-A of FIG. 2, in accordance with embodiments of the present disclosure.

As shown in FIGS. 2-4, retention assembly 200 may comprise a fixed member 202 and a movable member 204 mechanically coupled to fixed member 202 as described in more detail below. As shown in FIGS. 2-4, fixed member 202 may include plunger retention features 206, a plurality of tabs 208, vibrational damping material 210 formed on each of the plurality of tabs 208, and a plurality of guide bearings 212. Also as shown in FIGS. 2-4, movable member 204 may include a plunger 214, a guide slot 216, a plurality of guide slots 218, a plurality of tabs 220, and vibrational damping material 222 formed on each of the plurality of tabs 220. As also shown in FIGS. 2-4, retention assembly 200 may also include a fastener 226.

In operation, movable member 204 may be mechanically coupled to fixed member 202 such that movable member 204 may move back and forth in a linear axis. Each guide slot 218 of movable member 204 may mechanically couple to a respective guide bearing 212 of fixed member 202, such that movement of movable member 204 is constrained in a linear axis relative to fixed member 202 (e.g., in a horizontal axis of FIG. 2) and such that movement of movable member 204 relative to fixed member 202 is limited within such linear axis (e.g., limited by the lengths of guide slots 218).

Furthermore, guide slot 216 may be configured to receive fastener 226. Fastener 226 may include any suitable device, including without limitation, a screw. When fastener 226 is loosened such that it is mechanically disengaged from fixed member 202, guide slot 216 and fastener 226 may cooperate with guide slots 218 and guide bearings 212 to constrain and limit movement of movable member 204 relative to fixed member 202 as described in the previous paragraph. When fastener 226 is engaged with fixed member 202 (e.g., either via a corresponding receiving feature of fixed member 202 or simply by being in contact with the surface of side 201 of fixed member 202), the mechanical coupling of fastener 226 and fixed member 202 may prevent movement of movable member 204 relative to fixed member 202.

Plunger 214 may comprise any system, device, or apparatus that is mechanically coupled to movable member 204 and is configured to, responsive to human interaction or other physical interaction with plunger 214, move in a limited distance in an axis perpendicular to that of a surface of side 201 of fixed member 202 (e.g., perpendicular to the page with respect to FIG. 2 and in a vertical axis with respect to FIG. 4). In some embodiments, plunger 214 may include a spring to bias plunger 214 in a "down" position (e.g., in a downward direction with respect to FIG. 4) and a human may interact with plunger 214 with a force sufficient to overcome the spring force in order to move plunger 214 to an "up" position (e.g., in an upward direction with respect to FIG. 4). As shown in FIGS. 2-4, plunger 214 may include a feature configured to mechanically engage with one of the plunger retention features 206 of fixed member 202. While plunger retention features 206 are depicted in FIGS. 2-4 as holes formed through fixed member 202, plunger retention features 206 may comprise any suitable mechanical feature for mechanically engaging with plunger 214, including without limitation holes, embosses, indentations, or detents. When plunger 214 is engaged with a plunger retention feature 206, the mechanical coupling of plunger 214 with fixed member 202 may prevent movement of movable member 204 relative to fixed member 202. In addition, in some embodiments, plunger retention features 206 may be located on fixed member 202 in order to define a plurality of positions of movable member 204 relative to fixed member 202.

As movable member 204 is moved relative to fixed member 202, each tab 220 of movable member 204 may similarly move relative to a corresponding tab 208 of fixed member 202. Consequently, as a tab 220 is moved relative to a corresponding tab 208, such movement varies a length of a berth 228 between such tabs 220, 208. Accordingly, lengths of berths 228 may be set to accommodate an information handling resource card (e.g., printed circuit board) by setting the lengths of berth 228 to approximately equal lengths of the information handling resource cards to be retained by retention assembly 200. To set the length of berths 228, a human may interact with retention assembly 200 to move movable member 204 to a desired position relative to fixed member 202, and then cause either or both of plunger 214 to engage with a plunger retention feature 206 and fastener 226 to engage with fixed member 202 in order to constrain movable member 204 at the desired position relative to fixed member 202.

As mentioned above, each tab 208 may include a layer of vibrational damping material 210 formed thereon and each tab 220 may include a layer of vibrational damping material 222 formed thereon. Thus, when an information handling resource card is retained by retention assembly 200, vibrational damping material 210 may be located between the informational handling resource card and tab 208 and vibrational damping material 222 may be located between the information handling resource card and tab 220 in order to minimize transfer of vibrational energy from tabs 208, 220 to the information handling resource card. For instance, while many components of retention assembly 200, including tabs 208, 220, may be formed of metal, vibrational damping material 210 and vibrational damping material 222 may be formed of foam, rubber, or other vibrational damping material.

Although not depicted in FIGS. 2-4, in some embodiments, fixed member 202 may include one or more features for mechanically coupling retention assembly 200 to a chassis of an information handling system.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
a chassis; and
a retention assembly mechanically coupled to the chassis and configured to retain an information handling resource card, the retention assembly comprising:
a fixed member;
a movable member mechanically coupled to the fixed member such that the movable member is movable relative to the fixed member in a linear axis; and
at least one fastener configured to be enabled and disabled, such that when the at least one fastener is enabled, the at least one fastener is configured to mechanically engage with the fixed member in order to maintain the movable member in a desired position relative to the fixed member.

2. The information handling system of claim 1, wherein:
the fastener comprises a plunger; and
the fixed member comprises a plurality of plunger retention features, each configured to mechanically engage with a feature of the plunger in order to maintain the movable member in the desired position relative to the fixed member.

3. The information handling system of claim 1, wherein:
the movable member comprises a guide slot; and
the fastener is configured to engage with the guide slot and the fixed member such that the engagement of the fastener and the guide slot limits movement of the movable member relative to the fixed member in the linear axis when the fastener is disengaged from the fixed member, and configured to maintain the movable member in the desired position relative to the fixed member when the fastener is engaged with the fixed member.

4. The information handling system of claim 1, wherein:
the fixed member has a first tab;
the movable member has a second tab; and
the second tab is movable relative to the first tab as the movable member moves relative to the fixed member to define a variable-length berth for receiving the information handling resource card.

5. The information handling system of claim 4, wherein:
the first tab has a first layer of vibrational-damping material formed thereon to minimize transfer of vibrational energy from the first tab to the information handling resource card; and
the second tab has a second layer of vibrational-damping material formed thereon to minimize transfer of vibrational energy from the second tab to the information handling resource card.

6. The information handling system of claim 1, wherein:
the fixed member comprises a plurality of guide bearings;
the movable member comprises a plurality of guide slots;
each guide slot of the plurality of guide slots is coupled to a respective guide bearing of the plurality of guide bearings; and
the coupling between the plurality of guide bearings and the plurality of guide slots constrains movement of the movable member to the fixed member to the linear axis.

7. The information handling system of claim 1, wherein:
the fixed member comprises a plurality of guide bearings;
the movable member comprises a plurality of guide slots;
each guide slot of the plurality of guide slots is coupled to a respective guide bearing of the plurality of guide bearings; and the coupling between the plurality of guide bearings and the plurality of guide slots limits movement of the movable member to the fixed member within the linear axis.

8. A retention assembly configured to retain an information handling resource card, the retention assembly comprising:
a fixed member;
a movable member mechanically coupled to the fixed member such that the movable member is movable relative to the fixed member in a linear axis; and
at least one fastener configured to be enabled and disabled, such that when the at least one fastener is enabled, the at least one fastener is configured to mechanically engage with the fixed member in order to maintain the movable member in a desired position relative to the fixed member.

9. The retention assembly of claim 8, wherein:
the fastener comprises a plunger; and
the fixed member comprises a plurality of plunger retention features each configured to mechanically engage with a feature of the plunger in order to maintain the movable member in the desired position relative to the fixed member.

10. The retention assembly of claim 8, wherein:
the movable member comprises a guide slot; and
the fastener is configured to engage with the guide slot and the fixed member such that the engagement of the fastener and the guide slot limits movement of the movable member relative to the fixed member in the linear axis when the fastener is disengaged from the fixed member, and configured to maintain the movable member in the desired position relative to the fixed member when the fastener is engaged with the fixed member.

11. The retention assembly of claim 8, wherein:
the fixed member has a first tab;
the movable member has a second tab; and
the second tab is movable relative to the first tab as the movable member moves relative to the fixed member to define a variable-length berth for receiving the information handling resource card.

12. The retention assembly of claim 11, wherein:
the first tab has a first layer of vibrational-damping material formed thereon to minimize transfer of vibrational energy from the first tab to the information handling resource card; and
the second tab has a second layer of vibrational-damping material formed thereon to minimize transfer of vibrational energy from the second tab to the information handling resource card.

13. The retention assembly of claim 8, wherein:
the fixed member comprises a plurality of guide bearings;
the movable member comprises a plurality of guide slots;
each guide slot of the plurality of guide slots is coupled to a respective guide bearing of the plurality of guide bearings; and
the coupling between the plurality of guide bearings and the plurality of guide slots constrains movement of the movable member to the fixed member to the linear axis.

14. The retention assembly of claim 8, wherein:
the fixed member comprises a plurality of guide bearings;
the movable member comprises a plurality of guide slots;
each guide slot of the plurality of guide slots is coupled to a respective guide bearing of the plurality of guide bearings; and
the coupling between the plurality of guide bearings and the plurality of guide slots limits movement of the movable member to the fixed member within the linear axis.

15. A method for constructing a retention assembly configured to retain an information handling resource card, the method comprising:
mechanically coupling a movable member to a fixed member such that the movable member is movable relative to the fixed member in a linear axis; and
mechanically engaging at least one fastener with the fixed member in order to maintain the movable member in a desired position relative to the fixed member, wherein the at least one fastener is also configured to be disabled, such that when the at least one fastener is disabled, the at least one fastener does not maintain the movable member in the desired position relative to the fixed member.

16. The method of claim 15, wherein:
the fastener comprises a plunger; and
the fixed member comprises a plurality of plunger retention features each configured to mechanically engage with a feature of the plunger in order to maintain the movable member in the desired position relative to the fixed member.

17. The method of claim 15, wherein:
the movable member comprises a guide slot; and
the fastener is configured to engage with the guide slot and the fixed member such that the engagement of the fastener and the guide slot limits movement of the movable member relative to the fixed member in the linear axis when the fastener is disengaged from the fixed member, and configured to maintain the movable member in the desired position relative to the fixed member when the fastener is engaged with the fixed member.

18. The method of claim 15, wherein:
the fixed member has a first tab;
the movable member has a second tab; and
the second tab is movable relative to the first tab as the movable member moves relative to the fixed member to define a variable-length berth for receiving the information handling resource card.

19. The method of claim 18, further comprising:
forming a first layer of vibrational-damping material on the first tab to minimize transfer of vibrational energy from the first tab to the information handling resource card; and
forming a second layer of vibrational-damping material on the second tab to minimize transfer of vibrational energy from the second tab to the information handling resource card.

20. The method of claim 15, wherein:
the fixed member comprises a plurality of guide bearings;
the movable member comprises a plurality of guide slots;
each guide slot of the plurality of guide slots is coupled to a respective guide bearing of the plurality of guide bearings; and
the coupling between the plurality of guide bearings and the plurality of guide slots constrains movement of the movable member to the fixed member to the linear axis, and limits movement of the movable member to the fixed member within the linear axis.

* * * * *